US008871578B2

(12) United States Patent
Seo

(10) Patent No.: US 8,871,578 B2
(45) Date of Patent: Oct. 28, 2014

(54) METHOD FOR MANUFACTURING THIN FILM TRANSISTOR

(75) Inventor: Jong Hyun Seo, Seoul (KR)

(73) Assignee: Industry-University Cooperation Foundation Korea Aerospace University, Goyang-Si (KR)

( * ) Notice: Subject to any disclaimer, the term of this patent is extended or adjusted under 35 U.S.C. 154(b) by 9 days.

(21) Appl. No.: 13/881,948

(22) PCT Filed: Oct. 27, 2011

(86) PCT No.: PCT/KR2011/008081
§ 371 (c)(1),
(2), (4) Date: Apr. 26, 2013

(87) PCT Pub. No.: WO2012/057543
PCT Pub. Date: May 3, 2012

(65) Prior Publication Data
US 2013/0217192 A1    Aug. 22, 2013

(30) Foreign Application Priority Data
Oct. 29, 2010 (KR) .................. 10-2010-0106996

(51) Int. Cl.
H01L 21/84 (2006.01)
H01L 29/786 (2006.01)
H01L 27/12 (2006.01)
G02F 1/1368 (2006.01)

(52) U.S. Cl.
CPC .......... *H01L 29/786* (2013.01); *H01L 27/1225* (2013.01); *G02F 1/1368* (2013.01); *H01L 29/7869* (2013.01)
USPC ....................................... 438/158

(58) Field of Classification Search
CPC .. H01L 29/78; H01L 27/1251; H01L 29/4908
USPC .................. 438/149–158, 707–709, E21.222, 438/E21.218, E21.31, E21.257, E21.258; 257/359, 72, 40; 349/139, 140, 145; 216/62, 63, 66
See application file for complete search history.

(56) References Cited

U.S. PATENT DOCUMENTS

2010/0032679 A1* 2/2010 Kawae et al. ................... 257/72
2010/0176379 A1* 7/2010 Kim et al. ....................... 257/40

FOREIGN PATENT DOCUMENTS

JP    2010-165961 A    7/2010
KR   10-2003-0053570 A    7/2003
KR   10-2008-0003117 A    1/2008
KR   10-2009-0045884 A    5/2009

OTHER PUBLICATIONS

International Search Report for PCT/KR2011/008081 dated May 1, 2012.

* cited by examiner

*Primary Examiner* — Chuong A Luu
*Assistant Examiner* — Sheikh Maruf
(74) *Attorney, Agent, or Firm* — Pearne & Gordon LLP

(57) ABSTRACT

A method for manufacturing a thin film transistor includes forming a semiconductor layer, a wiring layer and a patterned mask layer in sequence on a substrate on which a gate electrode and a gate insulating layer are formed; patterning the wiring layer and the semiconductor layer based on the patterned mask layer while irradiating external light; removing at least a part of the mask layer; forming a channel portion by etching the wiring layer while controlling irradiation of the external light. Further, the method for manufacturing the thin film transistor can obtain an improved structure by forming the semiconductor layer made of an oxide which reacts to external light irradiated thereto, thus capable of adjusting a selectivity between the semiconductor layer and the wiring layer.

9 Claims, 3 Drawing Sheets

METHOD FOR MANUFACTURING THIN FILM TRANSISTOR

CROSS-REFERENCE TO RELATED APPLICATION

This Application is a U.S. national phase application under 35 U.S.C. §371 of PCT Application No. PCT/KR2011/008081 filed on Oct. 27, 2011, which claims the benefit of Korean Patent Application No. 10-2010-0106996 filed on Oct. 29, 2010, the entire disclosures of which are incorporated herein by reference.

TECHNICAL FIELD

The present disclosure relates to a method for manufacturing a thin film transistor; and, more particularly, relates to a method for manufacturing a thin film transistor having an improved structure by forming a semiconductor layer made of an IGZO-containing semiconducting oxide which reacts to external light irradiated thereto.

BACKGROUND ART

In order to watch a currently distributed HD 3D LCD TV, it is required to use special glasses. In order to embody a UD 3D LCD TV without needing to use such glasses, an image-driving speed needs to be increased from a current speed level of about 240 Hz to about 480 Hz.

To increase the image-driving speed to the required level, it may be essential to use an amorphous/crystalline oxide semiconductor thin film transistor (TFT), which features a highly improved speed, as compared to an amorphous silicon-based TFT having low electron mobility.

Required to manufacture such an oxide semiconductor TFT are a patterning technique for oxide semiconductor and an etching technique having a high selectivity between the oxide semiconductor and a data wiring structure formed thereon.

However, the oxide semiconductor is easily dissoluble in acid. Accordingly, if wet etching is performed when etching the data wiring structure on the oxide semiconductor, the oxide semiconductor may be dissolved in a solution used for the wet etching. Thus, it has been difficult to adjust the selectivity between the oxide semiconductor and the data wiring structure.

To resolve the problem, there is known a method for dry-etching the data wiring structure. A conventional thin film transistor is illustrated in FIG. 1. A gate electrode 21 and a gate insulating layer 20 are formed on a substrate having a $SiO_x$ film 15 deposited thereon. An oxide semiconductor 30 and a wiring structure 40 are deposited on the gate insulating layer 20 in sequence.

If dry etching is performed on the thin film transistor having the above structure, plasma damage may be inflicted on a surface of the oxide semiconductor 30. To prevent generation of the plasma damage, an etch stopper 50 is formed between the oxide semiconductor 30 and the wiring structure 40, as shown in FIG. 1.

In order to form the etch stopper, however, a photolithography process needs to be additionally performed, resulting in an increase of processing cost and time for the manufacture of the thin film transistor.

DISCLOSURE OF THE INVENTION

Problems to be Solved by the Invention

In view of the foregoing problems, the present disclose provides a method for manufacturing a thin film transistor having an improved structure by forming a semiconductor layer made of an IGZO-based oxide which reacts to external light irradiated thereto, thus capable of easily adjusting a selectivity between the semiconductor layer and a wiring layer.

Means for Solving the Problems

In accordance with an illustrative embodiment, there is provided a method for manufacturing a thin film transistor. The method for manufacturing a thin film transistor includes forming a semiconductor layer, a wiring layer and a patterned mask layer in sequence on a substrate on which a gate electrode and a gate insulating layer are formed; patterning the wiring layer and the semiconductor layer based on the patterned mask layer while irradiating external light; removing at least a part of the mask layer; forming a channel portion by etching the wiring layer while controlling irradiation of the external light.

Controlling the irradiation of the external light may include blocking the external light in order to prevent the semiconductor layer from being etched.

The semiconductor layer and the wiring layer may be formed by a dry deposition method.

Removing the mask layer may include using an oxygen plasma asking method.

The wiring layer may be a single-layered wiring layer, and the single-layered wiring layer may be made of pure molybdenum, a molybdenum alloy, a pure Ti, a Ti alloy, pure copper, a copper alloy, pure aluminum or an aluminum alloy.

The wiring layer may be double-layered wiring layer, and the double-layered wiring layer may include a metal layer and a buffer layer capable of preventing diffusion of the metal layer into the semiconductor layer.

The buffer layer of the double-layered wiring layer may contain at least one of pure molybdenum, a molybdenum alloy such as Mo—Ti, MoTa or MoNb, pure Ti and a Ti alloy.

The wiring layer may be a triple-layered wiring layer, and the triple-layered wiring layer may include a metal layer; a first buffer layer formed under the metal layer; and a second buffer layer formed on the metal layer.

Each of the first buffer layer and the second buffer layer may contain pure molybdenum or a molybdenum alloy such as Mo—Ti, MoTa or MoNb.

The present inventor has found out that when etching an IGZO-based oxide semiconductor layer, a reaction speed of the IGZO-based oxide semiconductor layer to the etching can be controlled by irradiating external light thereto. Based on this, the present inventor has reached the inventive concept of adjusting a selectivity between a semiconductor layer and a wiring structure when performing wet etching in the course of manufacturing a thin film transistor. That is, when etching the wiring structure and the semiconductor layer at the same time, patterning is performed while irradiating external light, whereas when etching only the wiring structure, patterning is performed while blocking the external light. In this way, the selectivity between the semiconductor layer and the wiring structure can be adjusted.

Effect of the Invention

In accordance with the illustrative embodiment, it is possible to provide a method for manufacturing a thin film transistor having an improved structure by forming a semiconductor layer made of an oxide which reacts to external light irradiated thereto, thus capable of adjusting a selectivity between the semiconductor layer and a wiring layer.

BEST MODE FOR CARRYING OUT THE INVENTION

Figure 1:
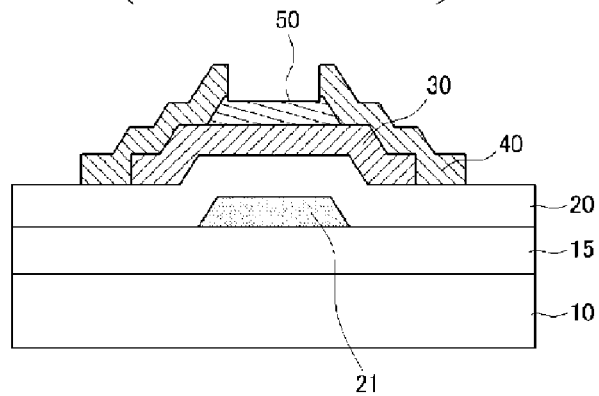
FIG. 1 is a cross sectional view illustrating a structure of a conventional thin film transistor.

Hereinafter, illustrative embodiments of the present disclosure will be described in detail with reference to the accompanying drawings so that inventive concept may be readily implemented by those skilled in the art. However, it is to be noted that the present disclosure is not limited to the illustrative embodiments but can be realized in various other ways. In the drawings, certain parts not directly relevant to the description are omitted to enhance the clarity of the drawings, and like reference numerals denote like parts throughout the whole document.

Throughout the whole document, the terms "connected to" or "coupled to" are used to designate connection or coupling of one element to another element and include both a case where an element is "directly connected or coupled to" another element and a case where an element is "electrically connected or coupled to" another element via still another element. Further, through the whole document, the term "comprises or includes" and/or "comprising or including" used in the document means that one or more other components, steps, operations, and/or the existence or addition of elements are not excluded in addition to the described components, steps, operations and/or elements.

Figure 2:
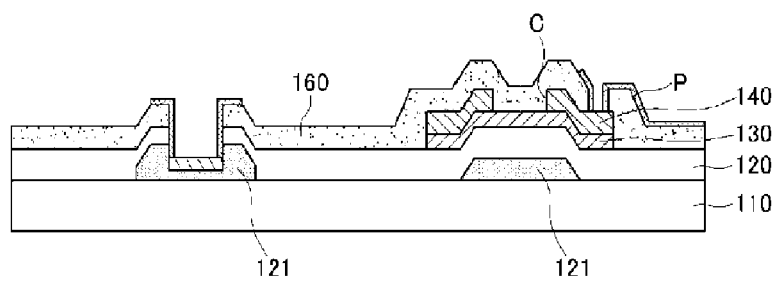
FIG. 2 is a cross sectional view illustrating a structure of a thin film transistor in accordance with an illustrative embodiment.
Figure 3:
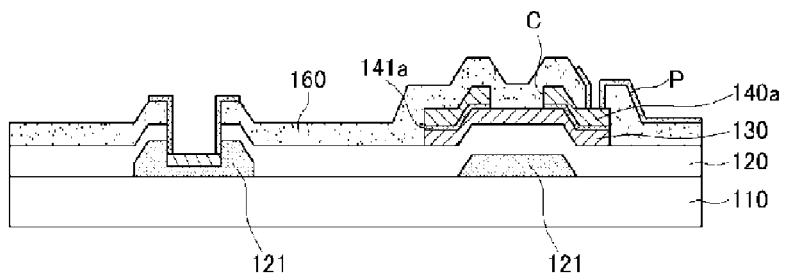
FIG. 3 is a cross sectional view illustrating a thin film transistor having a wiring layer of which structure is different from that of FIG. 2.
Figure 4:
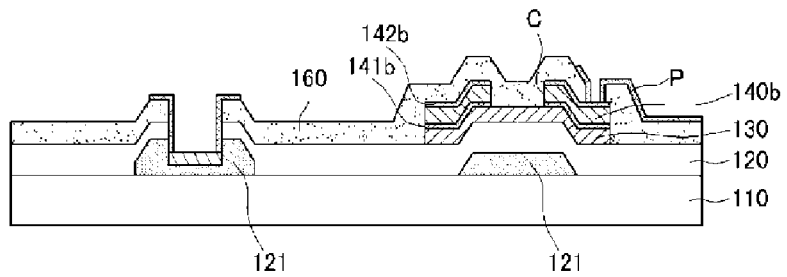
FIG. 4 is a cross sectional view illustrating a thin film transistor having a wiring layer of which structure is different from those of FIGS. 2 and 3.
Figure 5:
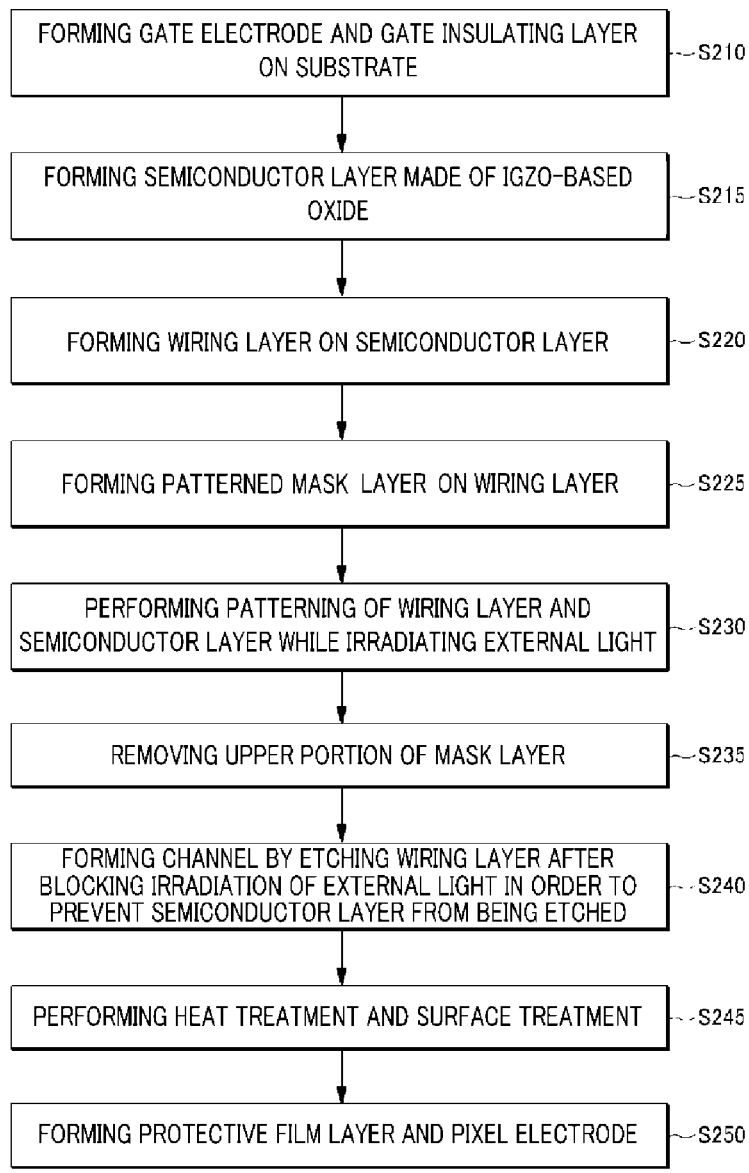
FIG. 5 is a flowchart for describing a sequence of a method for manufacturing a thin film transistor in accordance with an illustrative embodiment.

FIG. 2 is a cross sectional view illustrating a structure of a thin film transistor in accordance with an illustrative embodiment; FIG. 3 is a cross sectional view illustrating a thin film transistor having a wiring layer of which structure is different from that of FIG. 2; and FIG. 4 is a cross sectional view illustrating a thin film transistor having a wiring layer of which structure is different from those of FIGS. 2 and 3. Further, FIG. 5 is a flowchart for describing a sequence of a manufacturing method for a thin film transistor in accordance with an illustrative embodiment, and FIGS. 6A to 6E are cross sectional views illustrating a process of manufacturing a thin film transistor based on the flowchart of FIG. 5.

Referring to FIG. 2, a thin film transistor in accordance with an illustrative embodiment includes a substrate 110; a gate insulating layer 120 and a gate electrode 121 formed on the substrate 110; a semiconductor layer 130 formed on the gate insulating layer 120; and a wiring layer 140 having a single-layered structure without having an etch stopper.

First, the semiconductor layer 130 formed on the gate insulating layer 120 will be elaborated. The semiconductor layer is made of an IGZO-based oxide of which reaction speed to etching increases when external light is irradiated thereto. Here, the IGZO-based oxide is a generic term that refers to oxides including modified forms of IGZO and ZnO and novel combinations thereof, such as GaO, InO, SnO, ZnO, $TiO_2$, $Ta_2O_5$, and $HfO_2$.

The semiconductor layer 130 made of such the oxide has higher uniformity than that of a semiconductor layer made of low-temperature polycrystalline silicon. Further, the semiconductor layer 130 also has higher reliability and mobility than those of a semiconductor layer made of amorphous silicon or an organic material. That is, the performance of the semiconductor layer made of the oxide may be superior to those of the semiconductor layer made of the low-temperature polycrystal silicon and the semiconductor layer made of the amorphous silicon or the organic material.

The wiring layer 140 may be formed on the semiconductor layer 130 by deposition.

The structure of the semiconductor layer 130 and the wiring layer 140 will be more elaborated. The wiring layer formed on the semiconductor layer 130 may have a single-layered structure 140 or multi-layered structures 140a and 140b. In accordance with the present illustrative embodiment, the wiring layer 140 is formed to have the single-layered structure on the semiconductor layer 130.

When formed to have the single-layered structure, the wiring layer 140 may be made of pure molybdenum, a molybdenum alloy, pure Ti, a Ti alloy, pure copper, a copper alloy or an aluminum alloy.

Now, other illustrative embodiments in which multi-layered wiring layers 140a and 140b are formed on a semiconductor layer 130 will be discussed in detail with reference to FIGS. 3 and 4. The wiring layer 140a (140b) formed to have a multi-layered structure may be made of a metal such as copper or aluminum, and there may exist at least one buffer layer 141a (141b) for suppressing diffusion of the metal such as the copper or aluminum into the semiconductor layer 130 while improving a contact resistance between the metal and the semiconductor layer 130.

To elaborate, referring to FIG. 3, in case of forming, on the semiconductor layer 130, a wiring layer having a multi-layered structure, particularly, the wiring layer 140a having a double-layered structure, the buffer layer 141a in contact with the semiconductor layer 130 is further formed. The buffer layer 141a may be made of pure molybdenum, a molybdenum alloy such as Mo—Ti, MoTa or MoNb, pure Ti or a Ti alloy. Then, the wiring layer 140a made of copper is formed on the buffer layer 141a so as to be in contact with the buffer layer 141a.

Referring to FIG. 4, in case of forming, on the semiconductor layer 130, a wiring layer having a multi-layered structure, particularly, the wiring layer 140b having a triple-layered structure, a first buffer layer 141b is formed under the wiring layer 140b and a second buffer layer 142b is formed on the wiring layer 140b.

That is, the first buffer layer 141b is formed on the semiconductor layer 130 so as to be in contact with the semiconductor layer 130. The first buffer layer 141b may be made of, but not limited to, pure molybdenum or a molybdenum alloy such as Mo—Ti, MoTa or MoNb.

The wiring layer 140b made of a metal such as copper or aluminum is formed on the first buffer layer 141b so as to be in contact with the first buffer layer 141b. The second buffer layer 142b is formed on the wiring layer 140b so as to be in contact with the wiring layer 140b. Like the first buffer layer 141b, the second buffer layer 142b may be made of pure molybdenum or a molybdenum alloy such as Mo—Ti, MoTa or MoNb.

Now, the method for manufacturing the thin film transistor having the above-described structure will be described with reference to FIG. 5 and FIGS. 6A to 6E. Here, description will be provided focusing on a structure in which a wiring layer included in a thin film transistor has a single-layered structure.

Referring to FIG. 5 and FIGS. 6A to 6E, the method for manufacturing the thin film transistor in accordance with the illustrative embodiment includes steps of forming a semiconductor layer 130, a wiring layer 140 and a mask layer 150 in sequence on a substrate 110 on which a gate electrode 121 and a gate insulating layer 120 are formed; patterning the wiring layer 140 and the semiconductor layer 130 while irradiating external light thereto; removing a pattern of the mask layer 150; and etching the wiring layer 140 while controlling a light source.

Each step will be elaborated as follows.

Figure 6A:
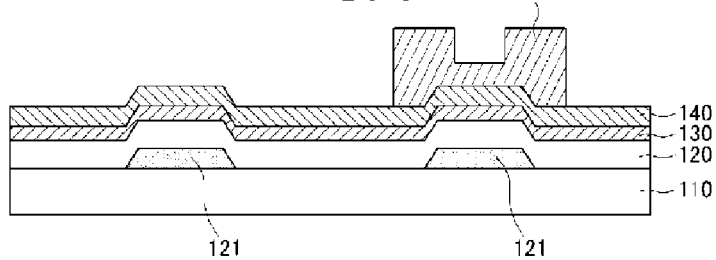
FIGS. 6A to 6E are cross sectional views illustrating a process of manufacturing a thin film transistor based on the flowchart of FIG. 5.

Referring to FIG. 6A, the gate electrode 121 is first formed on the substrate 110, and the gate insulating layer 120 is formed on the gate electrode 121 (S210). Then, the semiconductor layer 130 is formed on the gate insulating layer 120 (S215), and the wiring layer 140 is formed on the semiconductor layer 130 (S220).

In general, the gate insulating layer 120, the semiconductor layer 130 and the wiring layer 140 may be formed by a dry deposition method. Especially, it may be desirable to form these layers by a sputtering method. If these layers are formed by the sputtering method, high productivity would be achieved and reliability at thin film interfaces would be ameliorated.

In accordance with the present illustrative embodiment, the semiconductor layer 130 is formed by using an IGZO-based oxide including modified forms of IGZO and ZnO and combinations thereof, such as GaO, InO, SnO, ZnO, $TiO_2$, $Ta_2O_5$ and $HfO_2$. Then, the wiring layer 140 having the single-layered structure is formed on the semiconductor layer 130.

However, the structure of the semiconductor layer 130 and the wiring layer 140 may not be limited to the aforementioned example. As mentioned above, when the wiring layers 140a and 140b are made of a metal such as copper or aluminum, the buffer layers 141a, 141b and 142b for preventing diffusion of the metal such as copper or aluminum into the semiconductor layer 130 may be additionally formed.

Especially, in case of the wiring layer 140b made of aluminum and having the triple-layered structure, the buffer layer 141b is formed under the wiring layer 140b, and the buffer layer 142b is formed on the wiring layer 140b.

After the wiring layer 140 is formed, a single-layered patterned mask layer 150 is formed on the wiring layer 140 (S225). The patterned mask layer 150 may be formed by using a slit exposure technique. The mask layer 150 may be, but not limited to, a photoresist (PR) layer.

Figure 6B:
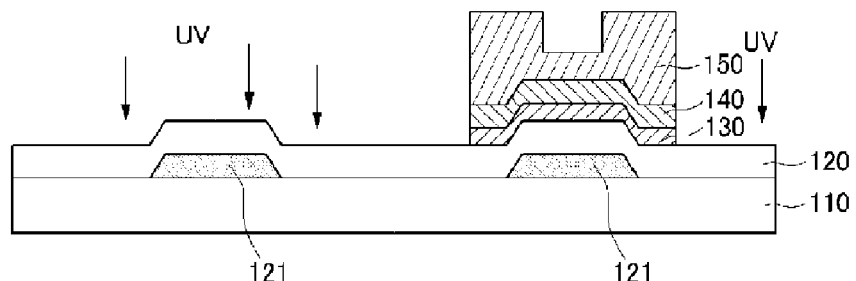

Then, referring to FIG. 6B, after the mask layer 150 is formed, the wiring layer 140 and the semiconductor layer 130 are patterned (S230). The wiring layer 140 and the semiconductor layer 130 are patterned by using the characteristic of the semiconductor layer 130 made of the IGZO-based oxide. In case of the semiconductor layer 130 made of the IGZO-based oxide, when external light, e.g., natural light or ultraviolet (UV) light is irradiated to the semiconductor layer 130, the reaction speed of the semiconductor layer to etching may increase.

Accordingly, in accordance with the present illustrative embodiment, when patterning the semiconductor layer 130 and the wiring layer 140, the patterning is performed while increasing the reaction speed by irradiating external light, particularly, UV.

Figure 6C:
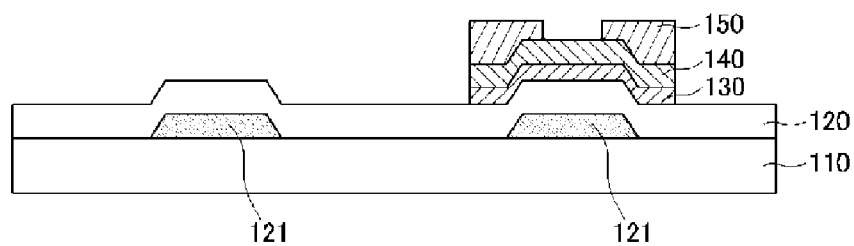

Then, referring to FIG. 6C, after the semiconductor layer 130 and the wiring layer 140 are patterned, an upper portion of the mask layer 150 is removed (S235). Here, the upper portion of the mask layer 140 may be removed by $O_2$ ashing, that is, by generating oxygen plasma by using a plasma ashing apparatus.

Alternatively, it may be also possible to remove the entire patterned mask layer 150 and, then, to form a new mask layer for etching the wiring layer 140 to be described later.

Figure 6D:
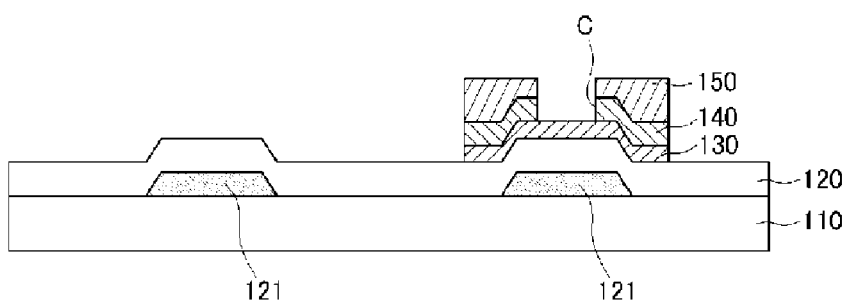
Figure 6E:
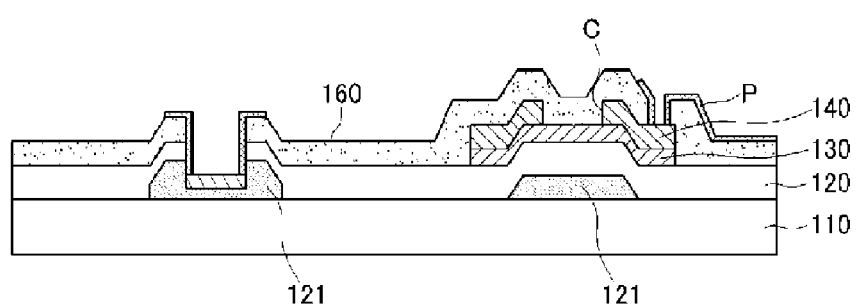

Referring to FIG. 6D, after removing the upper portion of the mask layer 150, a channel portion C is formed by etching the wiring layer 140 based on the mask layer 150 (S240). When forming the channel portion C, the wiring layer 140 is etched while controlling the external light. In accordance with the present illustrative embodiment, the etching of the wiring layer 140 is performed while blocking the external light completely as mentioned above, unlike in the patterning of the wiring layer 130 and the wiring layer 140 (S230).

As discussed above, the reaction speed of the semiconductor layer 130 to the etching would be increased if the external light is irradiated thereto. Thus, when forming the channel portion C, the semiconductor layer 130 needs to be protected so as not to be affected by the external light. For the reason, after blocking the external light (UV), only the wiring layer 140 is etched.

However, the external light may not be blocked completely as in the present illustrative embodiment. That is, it may be possible to control the irradiation of the external light such that a minimum amount of external light is irradiated so as not to affect the semiconductor layer 130 during the etching of the wiring layer 140.

After the channel portion C is formed, heat-treatment and surface treatment are performed to activate the channel portion C (S245). Then, a passivation layer 160 and a pixel electrode P are formed (S250), so that a thin film transistor is finally obtained.

In the thin film transistor manufactured by the above-described manufacturing method, the semiconductor layer 130 forming the thin film transistor is made of an IGZO-based oxide, i.e., modified forms of IGZO and ZnO, or novel combinations thereof such as GaO, InO, SnO, ZnO, $TiO_2$, $Ta_2O_5$, or $HfO_2$. Accordingly, a selectivity between the semiconductor layer 130 and the wiring layer 140 formed on and in contact with the semiconductor layer 130 can be easily adjusted.

Especially, the semiconductor layer 130 made of such the oxide has a characteristic that its reaction speed to etching increases as the external light is irradiated thereto. Thus, when patterning the semiconductor layer 130 and the wiring layer 140, the patterning can be performed rapidly by increasing the reaction speed by irradiating the external light. Meanwhile, when forming the channel portion by etching only the wiring layer 140, just by blocking the external light, only the wiring layer 140 can be selectively etched. Thus, the number of required processes can be reduced.

Furthermore, as compared to a case where an etching rate of the semiconductor layer is low, it may be possible to prevent over-etching of an upper data wiring exposed to an etching solution during the etching of the semiconductor layer.

Moreover, as compared to a conventional case where it has been difficult to adjust a selectivity between a semiconductor layer made of an oxide and a wiring layer, and, thus, an etch stopper is formed between the semiconductor layer and the wiring layer in order to prevent infliction of a damage, the etch stopper can be omitted in accordance with the illustrative embodiment. As a result, processing time can be shortened, and throughput can be increased while manufacturing cost can be greatly reduced.

The above description of the illustrative embodiments is provided for the purpose of illustration, and it would be understood by those skilled in the art that various changes and modifications may be made without changing technical conception and essential features of the illustrative embodiments. Thus, it is clear that the above-described illustrative embodiments are illustrative in all aspects and do not limit the present disclosure. For example, each component described to be of a single type can be implemented in a distributed manner. Likewise, components described to be distributed can be implemented in a combined manner.

The scope of the inventive concept is defined by the following claims and their equivalents rather than by the detailed description of the illustrative embodiments. It shall be understood that all modifications and embodiments conceived from the meaning and scope of the claims and their equivalents are included in the scope of the inventive concept.

What is claimed is:

1. A method for manufacturing a thin film transistor, the method comprising:
    forming a semiconductor layer made of an IGZO-based oxide, a wiring layer and a patterned mask layer in sequence on a substrate on which a gate electrode and a gate insulating layer are formed;
    etching the wiring layer and the semiconductor layer while irradiating external light, based on the patterned mask layer;
    removing at least a part of the mask layer to expose the wiring layer below the mask layer; and
    forming a channel portion by etching the exposed wiring layer while controlling or blocking irradiation of the external light to prevent over-etching of the semiconductor layer.

2. The method of claim 1, wherein the semiconductor layer and the wiring layer are formed by a dry deposition method.

3. The method of claim 1, wherein removing the mask layer includes using an oxygen plasma ashing method.

4. The method of claim 1, wherein the wiring layer is a single-layered wiring layer, and
    the single-layered wiring layer is made of pure molybdenum, a molybdenum alloy, a pure Ti, a Ti alloy, pure copper, a copper alloy, pure aluminum or an aluminum alloy.

5. The method of claim 1, wherein the wiring layer is a double-layered wiring layer, and
    the double-layered wiring layer includes a metal layer and a buffer layer capable of preventing diffusion of the metal layer into the semiconductor layer.

6. The method of claim 5, wherein the buffer layer of the double-layered wiring layer contains at least one of pure molybdenum, a molybdenum alloy such as Mo—Ti, MoTa or MoNb, pure Ti and a Ti alloy.

7. The method of claim 1, wherein the wiring layer is a triple-layered wiring layer, and:
    the triple-layered wiring layer includes:
    a metal layer;
    a first buffer layer formed under the metal layer; and
    a second buffer layer formed on the metal layer.

8. The method of claim 7, wherein each of the first buffer layer and the second buffer layer contains pure molybdenum or a molybdenum alloy such as Mo—Ti, MoTa or MoNb.

9. A method for manufacturing a thin film transistor, the method comprising:
    forming a semiconductor layer made of an IGZO-based oxide, a wiring layer and a patterned mask layer in sequence on a substrate on which a gate electrode and a gate insulating layer are formed;
    etching the wiring layer and the semiconductor layer while irradiating external light, based on the patterned mask layer;
    removing at least a part of the mask layer to expose the wiring layer below the mask layer; and
    forming a channel portion by etching the exposed wiring layer while controlling or blocking irradiation of the external light such that the external light does not affect the semiconductor layer.

* * * * *

UNITED STATES PATENT AND TRADEMARK OFFICE
CERTIFICATE OF CORRECTION

| | | |
|---|---|---|
| PATENT NO. | : 8,871,578 B2 | Page 1 of 1 |
| APPLICATION NO. | : 13/881948 | |
| DATED | : October 28, 2014 | |
| INVENTOR(S) | : Jong Hyun Seo | |

It is certified that error appears in the above-identified patent and that said Letters Patent is hereby corrected as shown below:

In the Specification, column 1, line 47; Please add "10" after -- substrate --

Signed and Sealed this
Fifth Day of May, 2015

Michelle K. Lee
*Director of the United States Patent and Trademark Office*